United States Patent [19]
Contiero et al.

[11] Patent Number: 6,022,778
[45] Date of Patent: Feb. 8, 2000

[54] PROCESS FOR THE MANUFACTURING OF INTEGRATED CIRCUITS COMPRISING LOW-VOLTAGE AND HIGH-VOLTAGE DMOS-TECHNOLOGY POWER DEVICES AND NON-VOLATILE MEMORY CELLS

[75] Inventors: Claudio Contiero, Buccinasco; Paola Galbiati, Monza; Michele Palmieri, Bitonto, all of Italy

[73] Assignee: SGS-Thomson Microelectronics, S.r.l., Agrate Brianza, Italy

[21] Appl. No.: 08/612,722

[22] Filed: Mar. 8, 1996

[30] Foreign Application Priority Data

Mar. 9, 1995 [EP] European Pat. Off. .............. 95830088

[51] Int. Cl.$^7$ ................................................. H01L 21/336
[52] U.S. Cl. .......................... 438/268; 438/273; 438/302; 438/257; 438/324
[58] Field of Search ..................................... 438/268, 273, 438/302, 306, 527, 257, 324; 148/DIG. 126

[56] References Cited

U.S. PATENT DOCUMENTS

| | | | |
|---|---|---|---|
| 4,417,385 | 11/1983 | Temple ...................................... | 438/302 |
| 5,045,492 | 9/1991 | Huie et al. ................................ | 438/206 |
| 5,057,448 | 10/1991 | Kuroda ..................................... | 438/241 |
| 5,296,393 | 3/1994 | Smayling et al. ........................ | 438/275 |
| 5,670,392 | 9/1997 | Ferla et al. ....................... | 148/DIG. 126 |

FOREIGN PATENT DOCUMENTS

| | | |
|---|---|---|
| 59-106152 | 6/1984 | Japan . |
| 64-64365 | 3/1989 | Japan . |
| 2-143454 | 6/1990 | Japan . |
| 890241972 | 2/1991 | Japan . |
| 4-44270 | 2/1992 | Japan . |
| 5-36719 | 2/1993 | Japan . |
| 5-211358 | 8/1993 | Japan . |

OTHER PUBLICATIONS

Devore, Joe et al, "A Monolithic Power Integrated Circuit Utilizing Non–Volatile Memory to Increase System Flexibility," in *Power Conversion & Intelligent Motion for the Intelligent Motion Conference*, Irvine, California, Oct. 24–29, 1993, pp. 41–49.

Watanabe, H. et al, "Scaling of Tunnel Oxide Thickness for Flash EEPROMs Realizing Stress–Induced Leakage Current Reduction," in 1994 *Symposium on VLSI Technology Digest of Technical Papers*, Honolulu, Hawaii, 1994, pp. 47–48.

Smayling, Michael, A Modular Merged Technology Process including Submicron CMOS Logic, Novolatile Memories, Linear Functions, and Power Components, in 1993 *Custom Integrated Circuits Conference*, San Diego, California, May 9–12, 1993, pp. 24.5.1–24.5.4.

*Primary Examiner*—Michael Trinh
*Attorney, Agent, or Firm*—David V. Carlson; Bryan A. Santarelli; Seed and Berry LLP

[57] ABSTRACT

A process for the manufacturing of an integrated circuit having DMOS-technology power devices and non-volatile memory cells provides for forming respective laterally displaced isolated semiconductor regions, electrically insulated from each other and from a common semiconductor substrate, inside which the devices will be formed; forming conductive gate regions for the DMOS-technology power devices and for the memory cells over the respective isolated semiconductor regions. Inside the isolated semiconductor regions for the DMOS-technology power devices, channel regions extending under the insulated gate regions are formed. The channel regions are formed by an implantation of a dopant along directions tilted of a prescribed angle with respect to a direction orthogonal to a top surface of the integrated circuit, in a dose and with an energy such that the channel regions are formed directly after the implantation of the dopant without performing a thermal diffusion at a high temperature of the dopant.

19 Claims, 10 Drawing Sheets

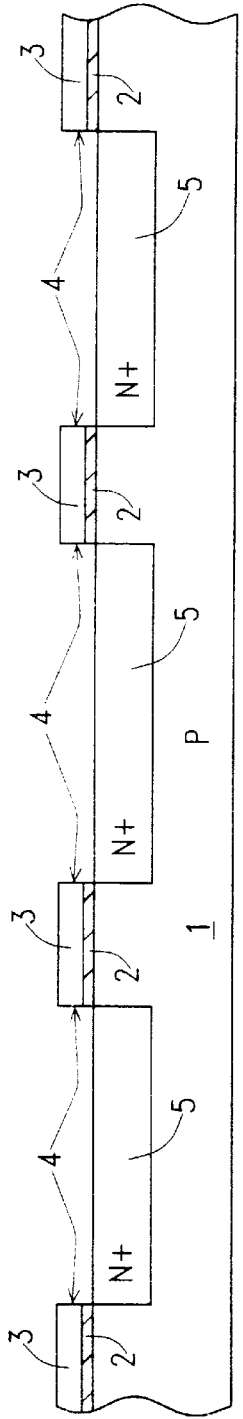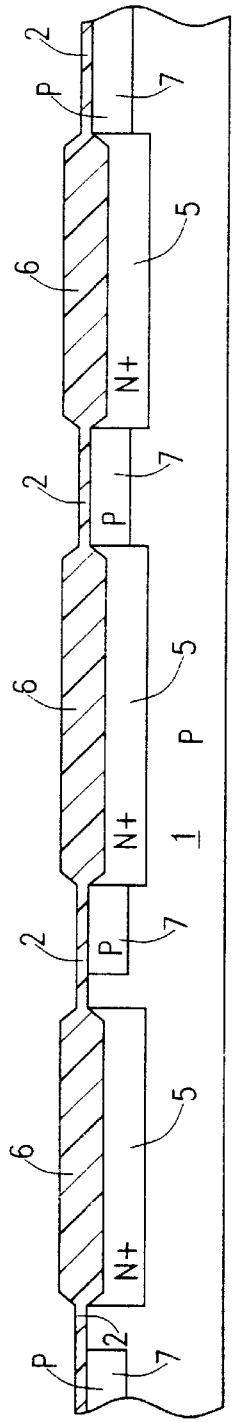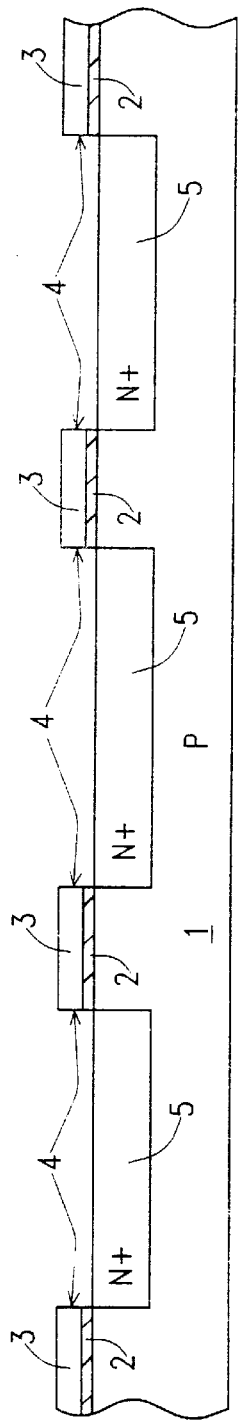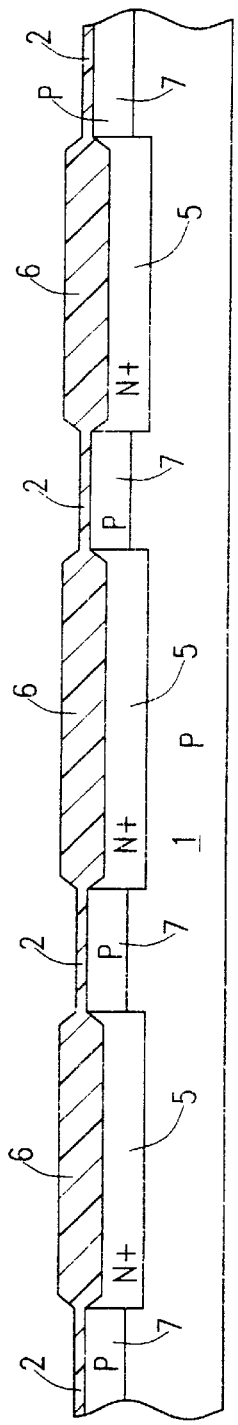

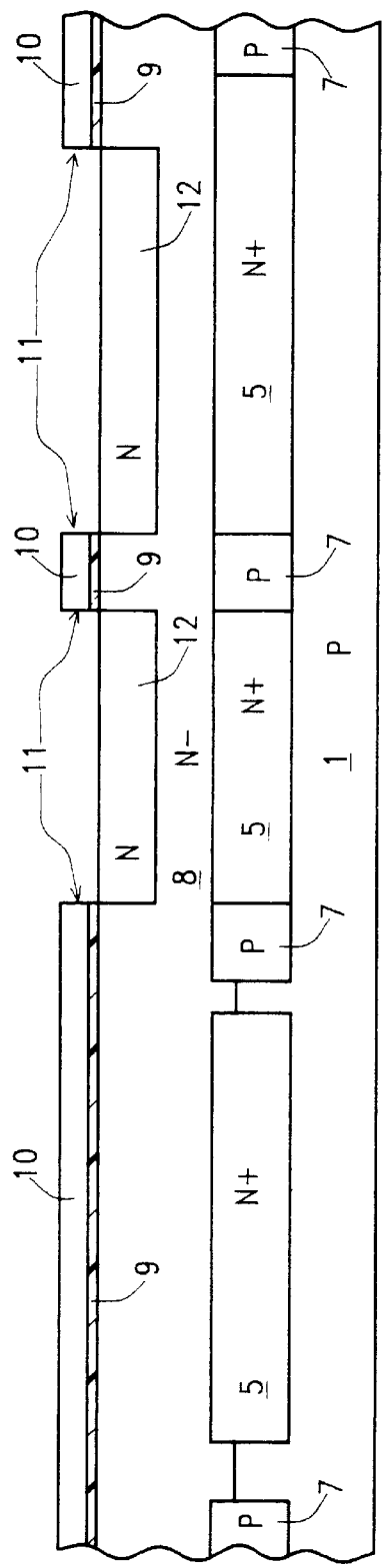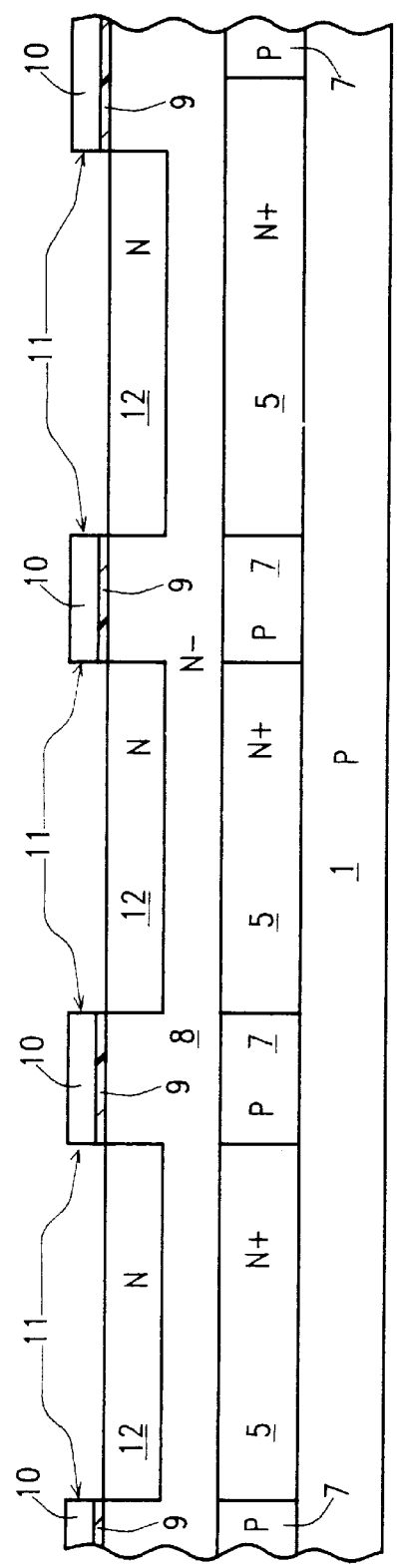

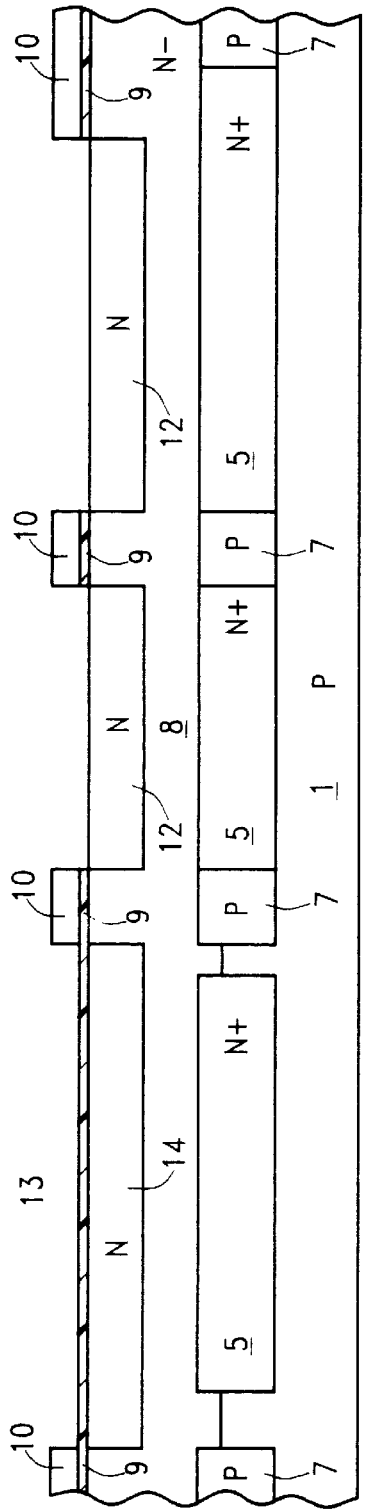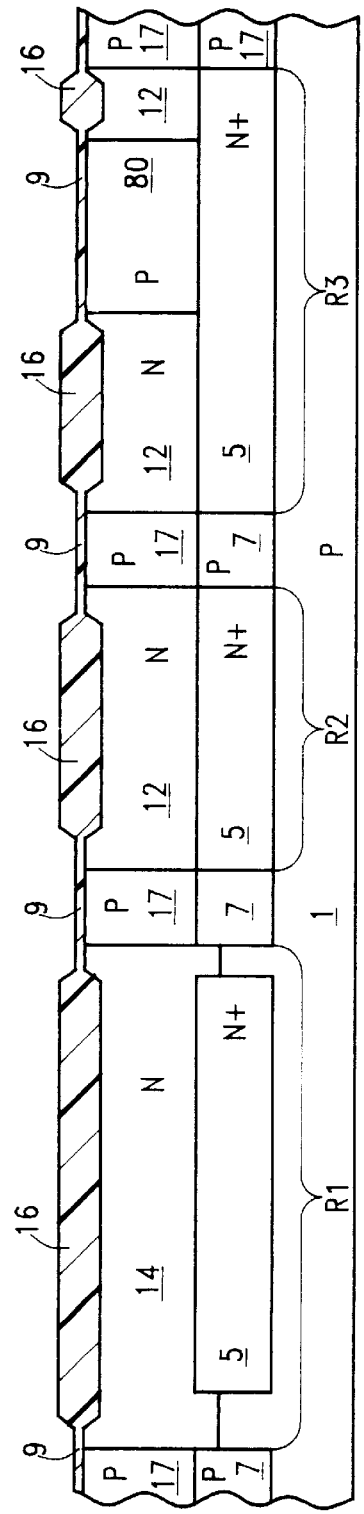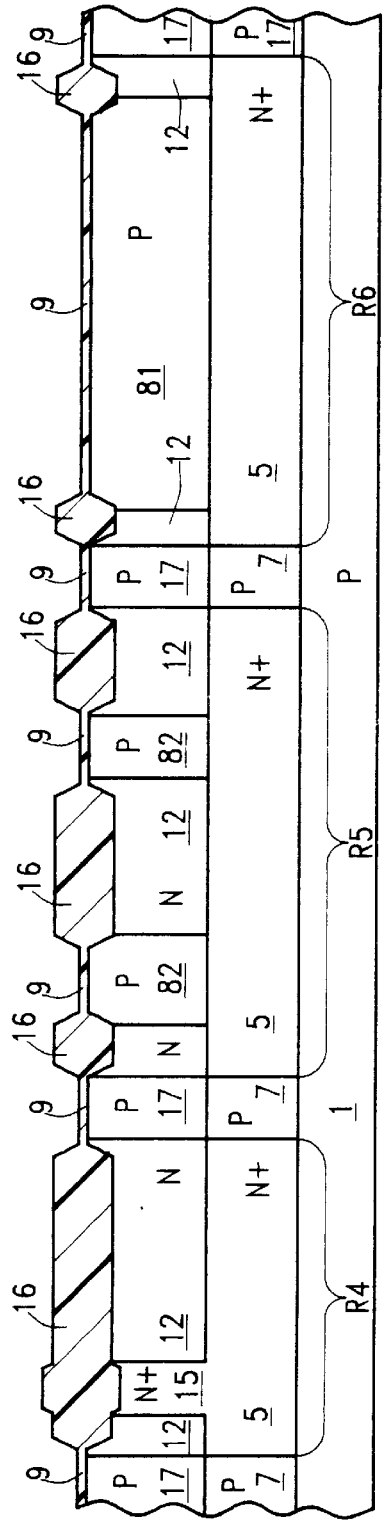

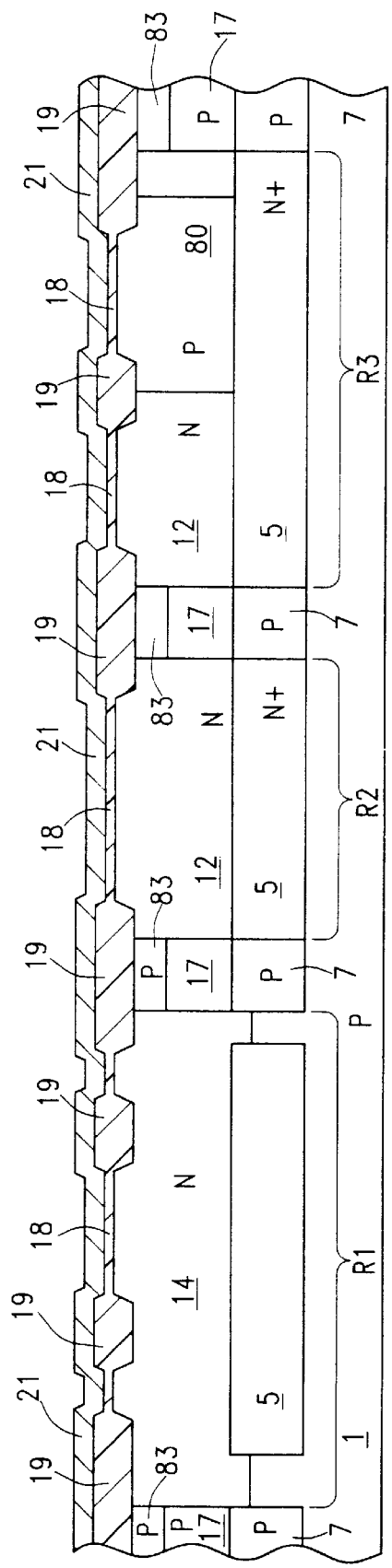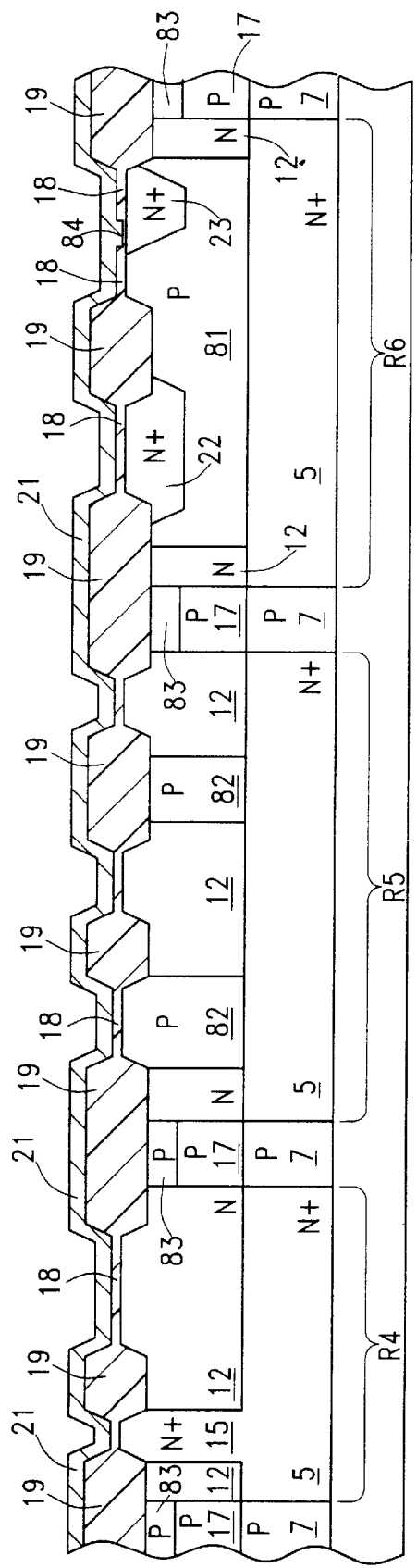

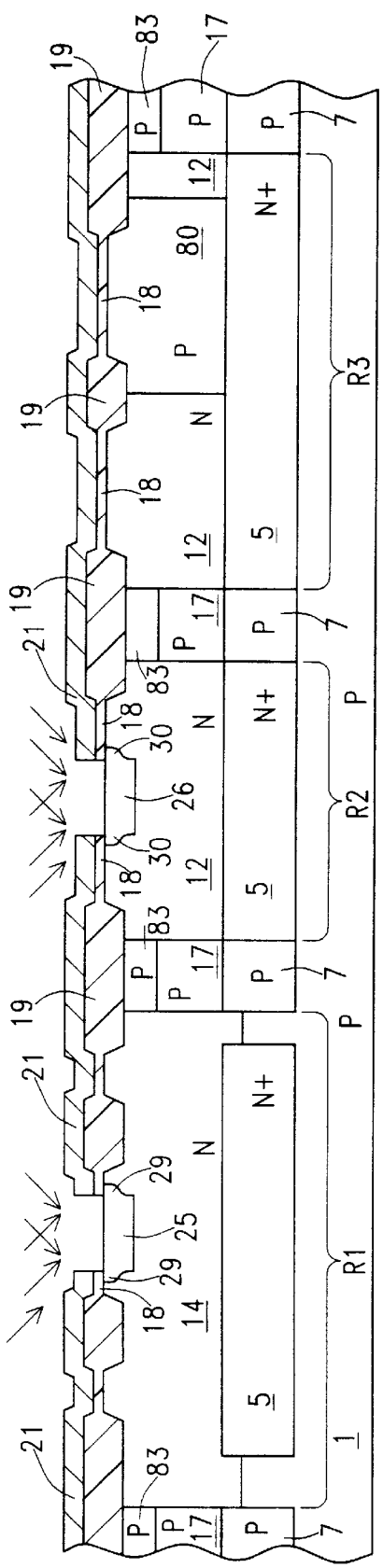
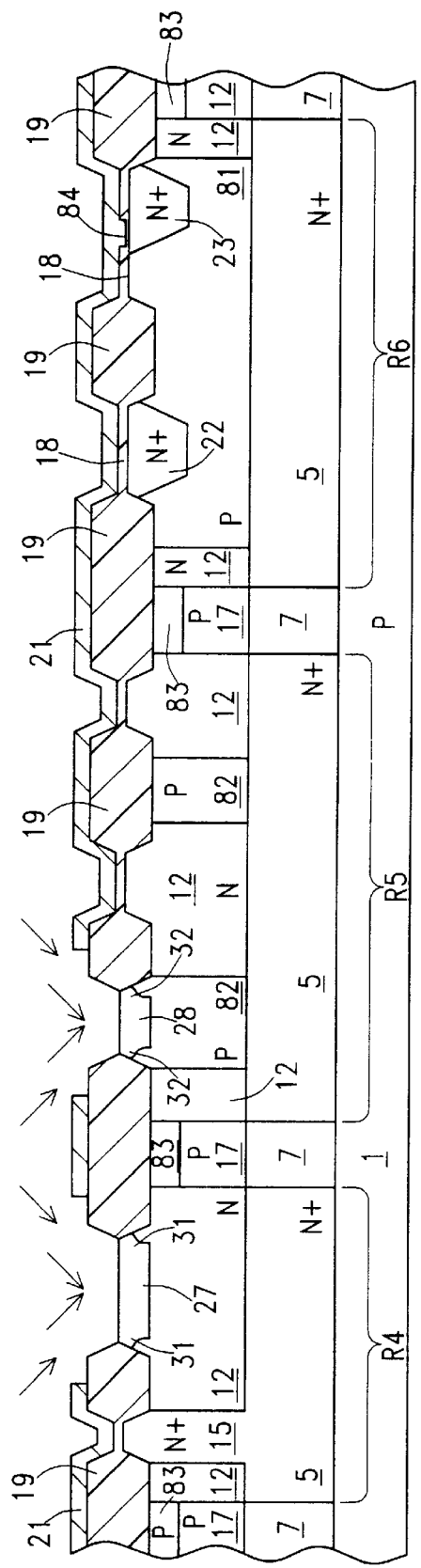
Fig.8A
Fig.8B

PROCESS FOR THE MANUFACTURING OF INTEGRATED CIRCUITS COMPRISING LOW-VOLTAGE AND HIGH-VOLTAGE DMOS-TECHNOLOGY POWER DEVICES AND NON-VOLATILE MEMORY CELLS

TECHNICAL FIELD

The present invention relates to a process for the manufacturing of integrated circuits comprising low-voltage and high-voltage DMOS-technology power devices and non-volatile memory cells.

BACKGROUND OF THE INVENTION

In the field of integrated circuits there is a trend towards the integration in a same semiconductor chip of different kinds of devices, such as DMOS-technology power devices, bipolar power devices, and low-voltage bipolar and CMOS devices.

The known manufacturing processes of DMOS-technology power devices (vertical or lateral DMOS transistors, IGBTs) involve long thermal processes at high temperatures. In fact, the channel region of the DMOS structure is formed by means of the difference in the lateral diffusion of dopants. In order to obtain DMOS devices with threshold voltages in the range of 1–2 V and with a breakdown voltage not limited by channel punchthrough, the temperature of the diffusion process must be higher than 1000° C.

On the contrary, in the field of VLSI circuits there is a trend towards a reduction of the thermal budgets of the diffusion processes: high temperature and/or long duration thermal processes are not suitable to achieve the desired reduction in the dimensions of the devices, and would increase the defectivity in the thinner oxide layers. This is particularly true for non-volatile memory devices, where oxide thicknesses lower than 80 Angstroms are typical.

Consequently, the known manufacturing processes for DMOS-technology power devices, involving such a high thermal budget, are not compatible with current manufacturing processes used in the fabrication of VLSI circuits.

SUMMARY OF THE INVENTION

In view of the state of the art described, it is an object of the present invention to provide a manufacturing process suitable for the fabrication of integrated circuits comprising DMOS-technology power devices and non-volatile memory cells.

According to the present invention, this object is achieved by a process for the manufacturing of an integrated circuit comprising DMOS-technology power devices and non-volatile memory cells that includes the steps of:

forming respective laterally displaced isolated semiconductor regions, electrically insulated from each other and from a common semiconductor substrate, inside which the devices will be formed;

forming conductive gate regions for the DMOS-technology power devices and for the memory cells over the respective isolated semiconductor regions;

inside the isolated semiconductor regions for the DMOS-technology power devices, forming channel regions extending under the conductive gate regions wherein the channel regions are formed by means of a first implantation of a first dopant along directions tilted of a prescribed angle with respect to a direction orthogonal to a top surface of the integrated circuit, in a dose and with an energy such that the channel regions are formed directly after the implantation without performing a thermal diffusion at a high temperature.

Deep body regions aligned with edges of the conductive gate regions can be formed by means of an implantation of a second dopant in a direction substantially orthogonal to a top surface. The energy and dose of this implantation are such that the concentration of the second dopant has a peak located at a prescribed distance from the surface in order to increase the charge of the body regions below the source region, useful to increase the device ruggedness.

In the manufacturing process according to the present invention long thermal diffusion processes at high temperatures are not required for the formation of the channel regions of the power devices. The process is therefore suitable to integrate in a single semiconductor chip DMOS-technology power devices and non-volatile memory cells. The process according to the invention also allows the integration, without additional steps, of MOSFETs and bipolar junction transistors, as well as of other kinds of devices.

BRIEF DESCRIPTION OF THE DRAWINGS

These and other features of the present invention will be made more evident by the following detailed description of two particular embodiments, described as non-limiting examples with reference to the annexed drawings, wherein:

FIGS. 1A–3A, 4, 5A, 6A are cross-sectional views showing initial manufacturing steps, common to both the embodiments of the process of the present invention, of a first group of integrated devices;

FIGS. 1B–3B, 5B, 6B are cross-sectional views of said initial manufacturing steps of a second group of integrated devices;

FIGS. 7A–9A and 7B–9B are cross-sectional views showing successive manufacturing steps of the first and second group of integrated devices, respectively, according to a first embodiment of the invention;

DETAILED DESCRIPTION OF THE INVENTION

Figure 7A:
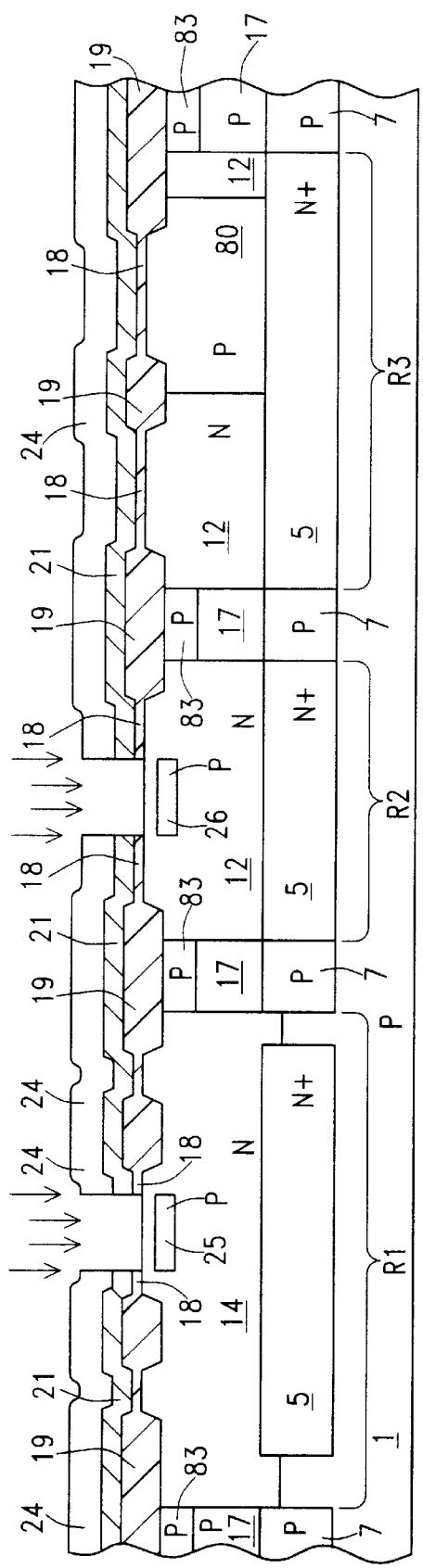

Two alternative embodiments of a process according to the present invention will be hereafter described; the initial and final process steps are common to both the embodiments.

In the following description there is described the manufacturing of a low-voltage Double-diffused MOS (DMOS) transistor, of a high-voltage DMOS transistor, of an EEPROM memory cell, of an NPN and a PNP bipolar junction transistors (BJTs) and of an N-channel and a P-channel MOSFETs. These, however, are not the only devices which can be integrated by means of the process of the invention. Other devices, such as diodes, condensers, resistors, and so on can be integrated in a straightforward way in a same semiconductor chip.

Referring to FIGS. 1A and 1B, the manufacturing process of the present invention starts with providing a P type substrate 1. Over a top surface of the substrate 1 an oxide layer 2 ("pad oxide") is formed, and a silicon nitride layer 3 ($Si_3N_4$) is deposited over the oxide layer 2. The silicon nitride layer 3 and the oxide layer 2 are then masked and etched, and thus selectively removed from the surface of the substrate 1, to open windows 4. A heavy dose of an N type dopant, typically arsenic in a dose of $10^{15}$–$10^{16}$ atoms/$cm^2$, is then implanted with an energy of about 120 keV into the substrate 1, through the windows 4; the dopant is then made to diffuse into the substrate 1 by means of a thermal process at 1100–1200° C. for about three hours, to form N+ regions 5.

Referring to FIGS. 2A and 2B, thick oxide areas 6 are then formed over the N+ regions 5, by means of the so-called "LOCOS" technique; the silicon nitride layer 3 is then completely removed from the oxide layer 2 in a conventional manner, and a P type dopant, typically boron, is implanted in a dose of the order of $10^{13}$ atoms/$cm^2$ and with an energy of about 25 keV into the substrate 1 through the oxide layer 2; the greater thickness of the oxide areas 6 with respect to the oxide layer 2 prevents the P type dopant from penetrating in the N+ regions 5. The dopant is then made to diffuse into the substrate 1 by means of a thermal process at 600–700° C. for about one hour, to form P isolation regions 7 between the N+ regions 5. Where high-voltage DMOS devices are formed (e.g., R1 in FIG. 5A), a mask layer (not shown) is formed after the formation of the oxide area 6, but before the implantation of the P type dopant that forms the isolation regions 7. Such a mask layer ensures that the P type isolation regions 7 do not contact the N+ buried regions 5 of the high-voltage DMOS devices.

The oxide layer 2 and the thick oxide areas 6 are then completely removed in a conventional manner.

Referring to FIGS. 3A and 3B, a lightly doped N type (N−) layer 8, with resistivity of about 15 Ohms-cm and thickness of about 4–5 um, is then epitaxially grown over the P type substrate 1; during this step, the N+ regions 5 and the P isolation regions 7 partially diffuse laterally and vertically. After the growth of the N− layer 8, the N+ regions 5 and the P isolation regions 7 are buried under the N− layer 8. The N+ regions 5 form so-called "buried layers" and the P regions 7 form so-called "bottom isolation regions".

An oxide layer 9 (pad oxide) is formed over a top surface of the N− layer 8, and a silicon nitride layer 10 is deposited over the oxide layer 9; the silicon nitride layer 10 and the oxide layer 9 are then masked and etched and thus selectively removed from the surface of the N− layer 8, to open windows 11. An N type dopant, for example phosphorous, is then implanted in a dose of about $10^{12}$–$10^{13}$ (preferably $8 \times 10^{12}$) atoms/$cm^2$ and with an energy of about 155 keV into the N− layer 8 through the windows 11, to form low-voltage N well regions 12.

Referring to FIG. 4, the silicon nitride layer 10 is then selectively removed from an area of the oxide layer 9 under which a high-voltage DMOS transistor (with breakdown voltage BV $\geq$ 40 V) is to be formed, to open a further window 13; an N type dopant, for example phosphorous, is then implanted in a lower dose (preferably $10^{12}$ atoms/$cm^2$) at an energy of about 155 keV into the N− layer 8 through the window 13 to form a high-voltage N well region 14. A heavy dose of an N type dopant is selectively implanted to form N+ sinker regions 15 (visible in FIG. 5B) used as collectors for the NPN BJT.

The dopants are then made to diffuse by means of a thermal process at about 1100–1200° C. for about three hours.

The remainder of the oxide layer 9 and the nitride layer 10 is then removed in a conventional manner.

Referring to FIGS. 5A and 5B, thick oxide areas 16 are then formed by means of the LOCOS technique.

A P type dopant, for example boron, is then selectively implanted in a dose of about $10^{12}$–$10^{13}$ atoms/$cm^2$ with an energy of about 25 keV into the N− layer 8, between the N+ buried regions 5, to form P well regions 17 over the P bottom isolation regions 7. This implantation step is also used to form P type well regions 80 for the N-channel MOSFETs as shown in FIG. 5A, and P type well regions 81 and 82 for the EEPROM memory cell and the PNP BJT, respectively, as shown in FIG. 5B. The thick oxide areas 16 acts as a mask for the implanted dopant.

A thermal process at about 1100° C. for about two hours is then performed. During this step, the P well regions 17 diffuse downwardly and merge with the P bottom isolation regions 7; also, the low-voltage N well regions 12, the high-voltage N well region 14 and the N+ sinker region 15 diffuse downward in the N− layer 8. In this way, laterally displaced semiconductor regions R1–R3 of FIG. 5A and R4–R6 of FIG. 5B are formed such that they are electrically isolated from each other, by means of the P bottom isolation regions 7 and the P well regions 17 and separated from the substrate 1, by means of the N+ buried regions 5. In regions R1 and R2 a high-voltage DMOS transistor and a low-voltage DMOS transistor will be respectively formed; in region R3, an N-channel MOSFET and a P-channel MOSFET will be respectively formed; in regions R4 and R5 an NPN BJT and a PNP BJT will be respectively formed; and in region R6, an EEPROM cell will be formed.

After this, the oxide layer made up of the oxide areas 9 and 16 is completely removed in a conventional manner.

Referring to FIGS. 6A and 6B, active areas are then defined on the top surface of the N− layer 8. As known to those skilled in the art, this provides for selectively implanting a P type dopant, such as boron, in a dose of about $10^{12}$–$10^{13}$ atoms/$cm^2$ with an energy of about 120 keV to form top field isolation regions 83. Thick field oxide areas 19 are then selectively formed by means of the LOCOS technique.

Thin gate oxide areas 18, with a thickness of about 200 Angstroms, are then formed between the field oxide areas 19. Also, as shown in FIG. 6B, a tunnel oxide area 84, about 80 Angstroms thick, is selectively formed over region R6 wherein the EEPROM memory cell is to be formed.

In region R6 wherein an EEPROM memory cell is to be formed, an N type dopant is implanted in the P well region 81 to form two N+ regions 22 and 23. Region 22 forms a control gate diffusion for the EEPROM memory cell; region 23 forms a tunnel region.

Still referring to FIGS. 6A and 6B, a polysilicon layer 21, with a thickness of about 2500 Angstroms, is then deposited over the whole surface of the oxide areas 18 and 19. Over the polysilicon layer 21, a silicide layer (e.g., tungsten silicide) can also be deposited, to enhance the conductivity.

The steps described above in conjunction with FIGS. 1A–3A, 4, 5A–6A, 1B–3B and 5B–6B are common to both the embodiments of the process of the present invention.

Figure 7B:
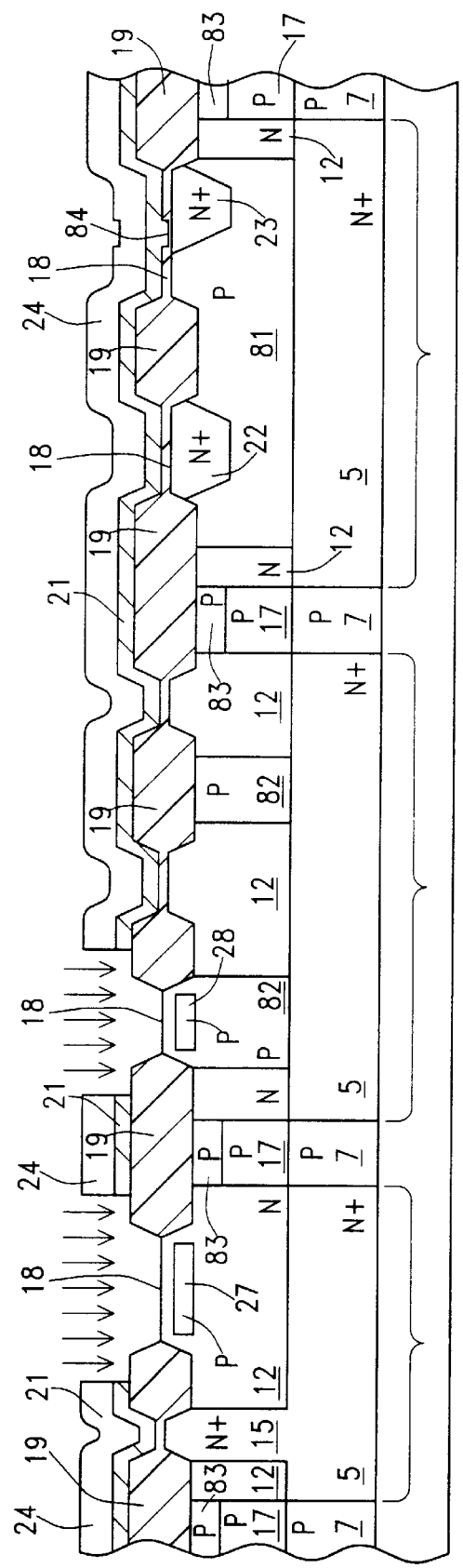

Referring to FIGS. 7A and 7B, according to a first embodiment of the present invention, a photoresist layer 24 is then formed over the polysilicon layer 21.

Referring to FIG. 7A, the photoresist layer 24 and the underlying polysilicon layer 21, and their gate oxide areas 18, are then masked and etched and selectively removed from the chip regions R1 and R2, wherein the high-voltage DMOS transistor and the low-voltage DMOS transistor are to be formed, to open windows through which a P type dopant, such as boron, is then implanted to form P deep-body regions 25 for the high-voltage DMOS transistor and deep-body regions 26 for the low-voltage DMOS transistor. The P deep-body regions 25 and 26 thus obtained are substantially aligned with the edges of the windows in the photoresist layer 24 and the polysilicon layer 21. The dopant is implanted orthogonally to the surface of the photoresist layer 24 in a dose of about $7\times10^{13}$ atoms/cm$^2$ and with an energy of 150–250 keV. Such a high energy is sufficient to locate the peak dopant concentration at a suitable distance from the surface of the N type wells 14 and 12 The presence of the photoresist layer 24 over the polysilicon layer 21 prevents the dopant from penetrating into the underlying oxide layer 18. Due to this feature, the thin gate oxide layer 18 is not damaged, and the concentration of dopants at the surface of the regions 14 and 12 under the oxide layer 18 is not altered.

Referring to FIG. 7B, at the same time, the photoresist layer 24 and the underlying polysilicon layer 21 are also masked and etched and selectively removed from the chip regions R4 and R5, wherein the NPN and PNP BJTs are to be formed. The orthogonally implanted P type dopant gives rise to two P deep-body regions 27 and 28. Region 27 will form a base region for the NPN BJT, and region 28, formed inside the P well region 82, will form part of a collector region for the PNP BJT.

Referring to FIGS. 8A and 8B, the photoresist layer 24 is then completely removed in a conventional manner, and a P type dopant (e.g., boron) is implanted through the windows in the polysilicon layer 21 in a direction tilted of about 30–45 degrees with respect to the direction orthogonal to the surface of the polysilicon layer 21. With an implantation dose of about $7.5\times10^{12}$ atoms/cm$^2$ and an implantation energy of about 150 keV, it possible to form P channel regions 29 and 30 over and at the sides of the P deep body regions 25 and 26, respectively, extending under the gate oxide 18. At the same time, P regions 31 and 32 are formed over and at the sides of the P deep body regions 27 and 28 for the NPN and PNP BJTs, respectively.

A thermal process of less than two hours at a temperature not higher than 900° C. is then performed to activate the dopants (thermal annealing). This thermal process has a thermal budget much lower than that of known processes. Due to this feature, the thermal process provided in the present invention is compatible with the manufacturing of, for example, EEPROM memory cells, whose tunnel oxides cannot be subjected to excessively high temperatures for long time periods without introducing defects. After the thermal annealing, the concentration of P type dopants at the surface of the N type well regions 12 and 14 is of the order of $1-2\times10^{17}$ atoms/cm$^3$. This allows obtaining a threshold voltage on the order of 1 V for the high-voltage and low-voltage DMOS transistors. It should be noted that, differently from the conventional processes the channel regions 29 and 30 are not formed by lateral diffusion of dopants, but directly by the titled implant. The provision of the deep body regions 25 and 26 increases the device ruggedness, but it is not strictly necessary.

Figure 9A:
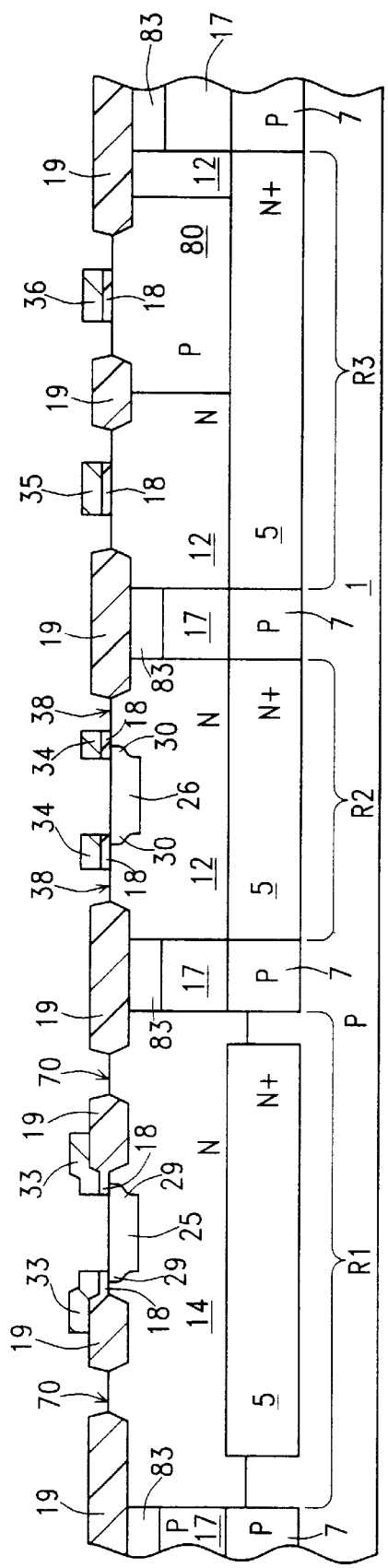
Figure 9B:
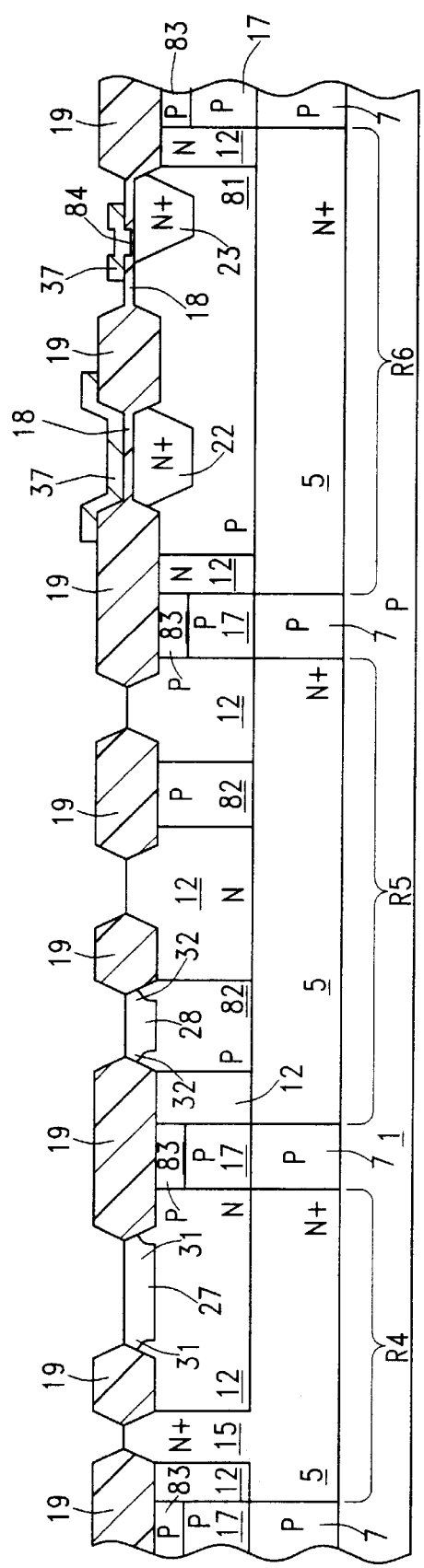

Referring to FIGS. 9A and 9B, the polysilicon layer 21 is then masked and etched and selectively removed to define polysilicon gates 33, 34, 35 and 36 for the high-voltage DMOS transistor, the low-voltage DMOS transistor, and the P-channel and N-channel MOSFETs, respectively, and a polysilicon floating gate 37 for the EEPROM memory cell.

Over regions R1 and R2, drain windows 70 and 38, respectively, are also opened in the polysilicon layer 21.

Figure 12A:
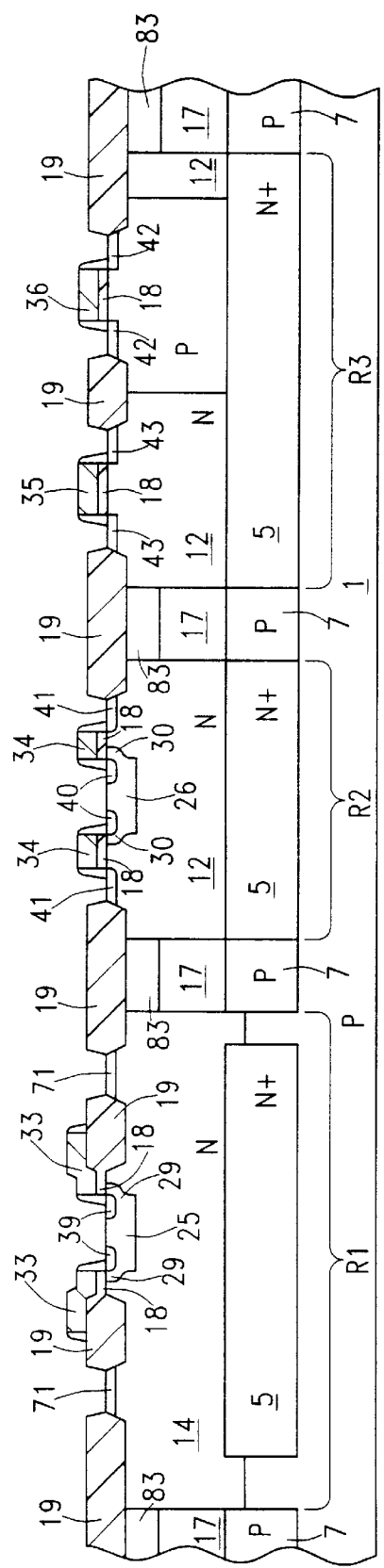
FIGS. 12A and 12B are cross-sectional views showing a further manufacturing step for the first and second group of integrated devices, respectively, common to both the embodiments of the invention.
Figure 12B:
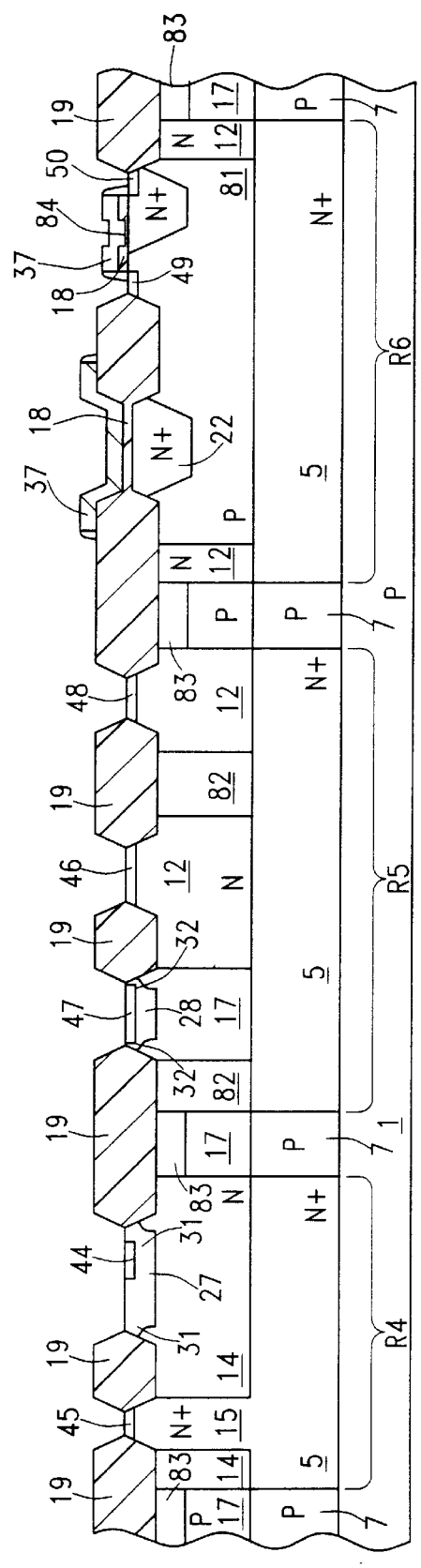

Referring to FIGS. 12A and 12B, the process continues in a conventional manner with two implant steps of an N type and a P type dopant to form lightly-doped drain regions at the sides of the polysilicon gates 33–37, the formation of oxide sidewall spacers at the sides of the polysilicon gates 33–37, and the formation of N+ source regions 39 and 40 for the DMOS transistors, N+ drain regions 71 and 41 for the DMOS transistors, N+source and drain regions 42 for the N-channel MOSFETs, P+ source and drain regions 43 for the P-channel MOSFETs, an N+ emitter region 44 and an N+ collector contact region 45 for the NPN BJT, P+ emitter and collector regions 46 and 47 for the PNP BJT and an N+ base contact region 48, and N+ source and drain regions 49 and 50 for the EEPROM memory cell. All N+ regions are formed by means of a same implantation of an N type dopant, e.g., arsenic, in a dose of about $10^{15}-10^{16}$ atoms/cm$^2$ with an energy of about 60 keV, and all P+ regions are formed by means of a same implantation of a P type dopant, e.g., BF2, in a dose of about $10_{15}$ atoms/cm$^2$ and with an energy of about 70 keV.

In one embodiment of the invention, the transistors R1 and R2 operate as lateral DMOS devices. That is, referring to transistor R1 in FIG. 12A, the charge carriers flow directly from the source region 39, through a channel formed at or near the surface of the channel region 29 beneath the polysilicon gate 33 and the gate oxide 18, through the region 14, and to the drain regions 71.

In another embodiment of the invention, the transistors R1 and R2 operate as vertical DMOS devices. That is, referring to the transistor R1 of FIG. 12A, the respective distances between the source region 39 and the drain regions 71, and between the deep body region 25 and the buried region 5, can be adjusted such that the charge carriers flow from the source region 39, through the channel formed at or near the surface of the channel regions 29, through the N region 14, across the buried region 5, and back through the N region 14 to the drain region 71. Additionally, the drain region 71 may be formed deeper to be in contact with the buried layer 5.

Although the above embodiments are described with reference to the device R1 of FIG. 12A, the device R2 of FIG. 12A and the devices R1 and R2 of FIG. 11A can be formed to operate similarly to the described embodiments of R1 of FIG. 12A.

Figure 10A:
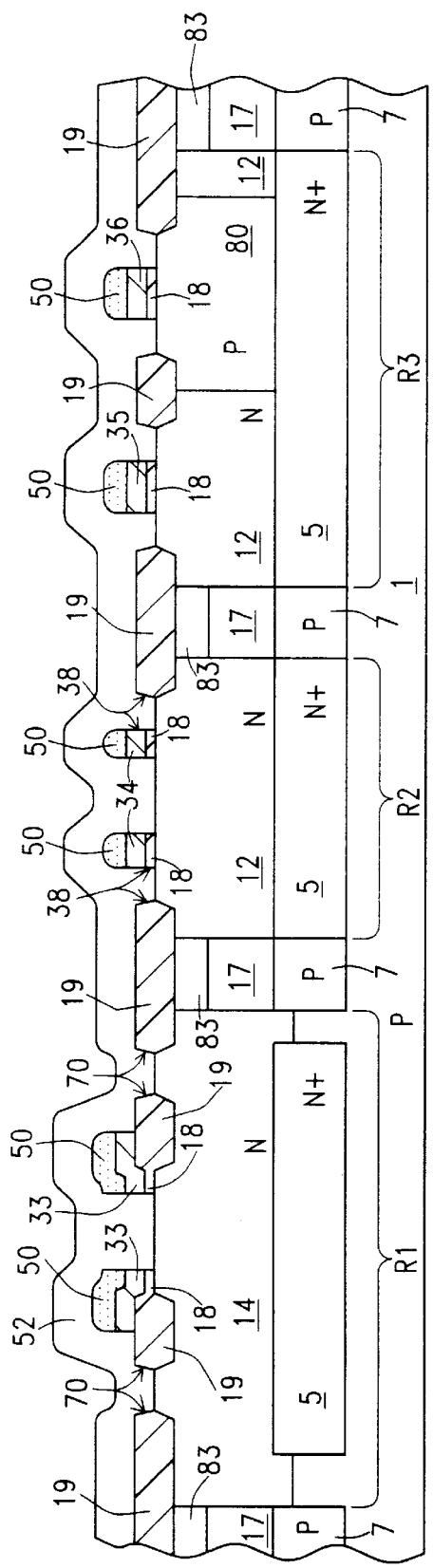
FIGS. 10A, 11A and 10B, 11B are cross-sectional views showing alternative successive manufacturing steps of the first and second group of integrated devices, respectively, according to a second embodiment of the invention.
Figure 10B:
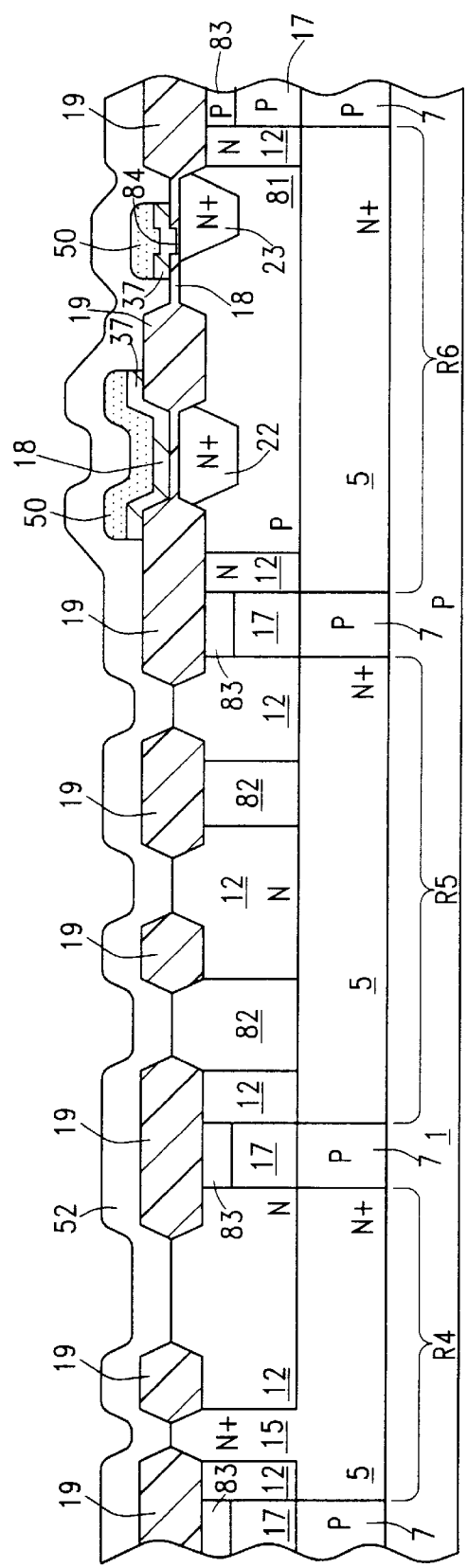

Referring to FIGS. 10A and 10B, a second embodiment of the process of the present invention provides for the deposition of a first photoresist layer 50 over the polysilicon layer 21 (not shown). The first photoresist layer 50 and the underlying polysilicon layer 21 are then masked and etched and selectively removed to define the gates 33–37 of the DMOS transistors, the N-channel and P-channel MOSFETs, and the EEPROM memory cell, and the drain windows 70 and 38 for the DMOS transistors, and emitter, base and collectors of the BJTs.

Still referring to FIGS. 10A and 10B, a second photoresist layer 52 is then deposited over the whole surface of the chip.

Figure 11A:
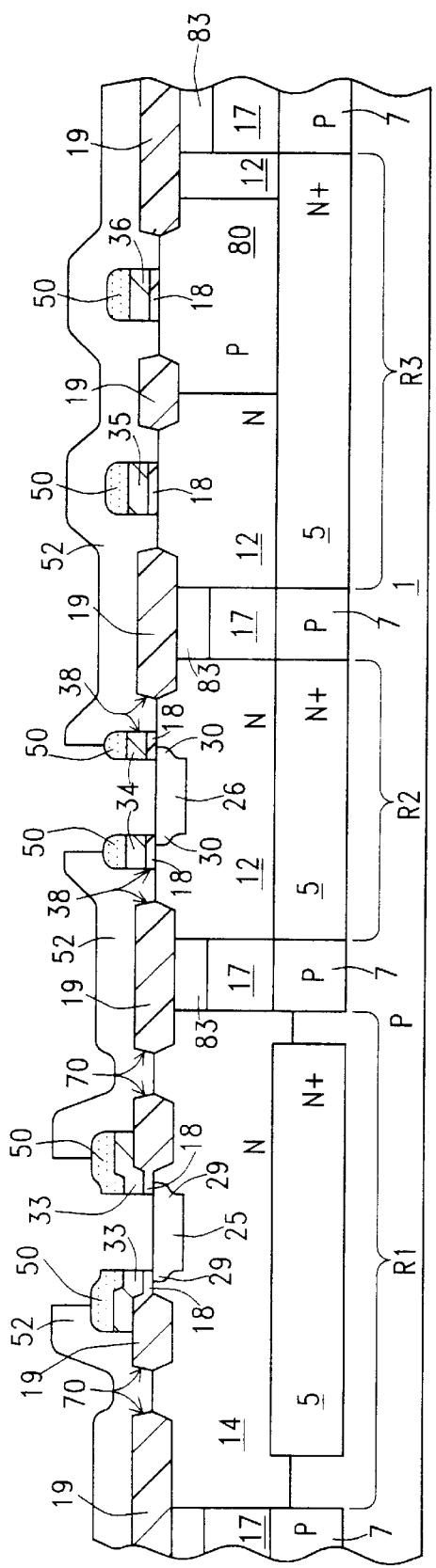
Figure 11B:
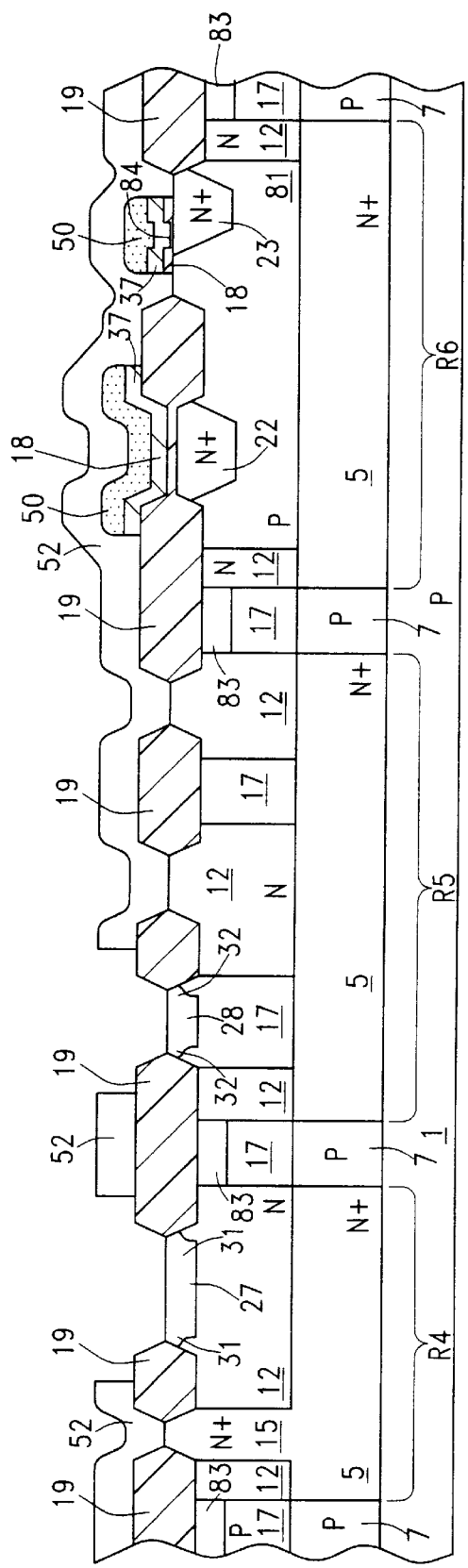

Referring to FIGS. 11A and 11B, the photoresist layer 52 is removed from the chip regions where the deep body regions of the DMOS transistors are to be formed, but not over the drain contact windows 70 and 38 for the DMOS transistors, and from the regions where the base of the NPN BJT and the collector of PNP BJT are to be formed.

Still referring to FIGS. 11A and 11B, similarly to the process according to the first embodiment, a heavy dose of a P type dopant is then implanted in a direction orthogonal to the surface of the chip, to form the P+ deep body regions 25–28, and then a P type dopant is implanted with implantation angles tilted of about 30–45 degrees with respect to the orthogonal direction, to form the P regions 29–32 at the sides of the P+ deep body regions 25–28.

The second photoresist layer 52 and the remaining first photoresist layer 50 are then completely removed. From this point on, the process steps are the same as those described above for the first embodiment of the process.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A process for manufacturing an integrated circuit that includes a DMOS power device and a non-volatile memory cell, the process comprising the steps of:

forming, in a semiconductor layer having a surface, a DMOS region in which the DMOS power device is to be formed;

forming in the semiconductor layer a cell region in which the non-volatile memory cell is to be formed, the cell region being laterally spaced from the DMOS region;

forming a dielectric layer on the DMOS and cell regions;

forming from the dielectric layer a DMOS gate dielectric over a portion of the DMOS region;

forming a DMOS body in the DMOS region after forming the DMOS gate dielectric;

implanting a first dopant at an acute angle to a direction orthogonal to the semiconductor layer surface to form in the DMOS region a channel region that extends laterally outward from the DMOS body and beneath the DMOS gate dielectric; and forming from the dielectric layer a cell gate dielectric over a portion of the cell region.

2. The process of claim 1 wherein the step of forming a DMOS body comprises implanting a second dopant in a direction orthogonal to the surface of the semiconductor layer to form the DMOS body:

wherein the DMOS body is spaced from the layer surface; and wherein the channel region is located at the sides of the DMOS body.

3. The process of claim 2 wherein the implanting a first dopant and the implanting a second dopant comprise implanting first and second doses of the first and the second dopants respectively, the second dose greater than the first dose.

4. The process of claim 2 wherein the implanting a first dopant and the implanting a second dopant comprise implanting the first and the second dopants at respective first and second energy levels, the second energy level higher than the first energy level.

5. The process of claim 2 wherein the implanting a first dopant and the implanting a second dopant comprise implanting the first and the second dopants at equal energy levels.

6. The process of claim 1 wherein the acute angle is in a range of approximately 30 to 45 degrees.

7. The process of claim 2 wherein the implanting of a first dopant and the implanting of a second dopant comprise:

implanting the second dopant with a dose of approximately $7 \times 10^{13}$ atoms/cm$^2$ and at an energy of approximately 150–250 keV; and implanting the first dopant with a dose of approximately $7.5 \times 10^{12}$ atoms/cm$^2$ and at an energy of approximately 150 keV.

8. The process of claim 1, further comprising:

forming the semiconductor layer having a first conductivity on a semiconductor substrate having a second conductivity;

forming in the substrate first and second heavily doped buried regions of the first conductivity to isolate the DMOS and the cell regions respectively from the substrate; and forming in the substrate and the semiconductor layer one or more isolation regions of the second conductivity to isolate the DMOS region from the cell region.

9. The process of claim 1, further comprising forming in the semiconductor layer a bipolar region in which a bipolar transistor is to be formed, the bipolar region being laterally spaced from the DMOS and cell regions.

10. The process of claim 1, further comprising forming in the semiconductor layer one or more MOS regions in which one or more MOS transistors are to be formed, the one or more MOS regions being laterally spaced from the DMOS and cell regions.

11. Process for the manufacturing of an integrated circuit comprising DMOS-technology power devices and non-volatile memory cells providing for the steps of:

forming respective laterally displaced isolated DMOS and cell semiconductor regions, electrically insulated from each other and from a common semiconductor substrate, inside which the DMOS devices and memory cells will be formed;

forming an insulator layer on the DMOS and cell semiconductor regions;

forming from the insulator layer insulative gate regions for the DMOS devices and the memory cells over the respective isolated DMOS and cell semiconductor regions;

forming respective conductive gate regions for the DMOS devices and for the memory cells on the insulative gate regions;

forming respective DMOS body regions in the DMOS semiconductor regions after forming the insulative gate regions for the DMOS devices;

inside the isolated semiconductor regions for the DMOS-technology power devices, forming channel regions extending laterally outward from the respective DMOS body regions and under the conductive gate regions, wherein:

said channel regions are formed by performing a first implantation of a first dopant along directions tilted of an acute angle with respect to a direction orthogonal to a top surface of the integrated circuit, in a dose and with an energy such that said channel regions are formed directly after the implantation of the first dopant without performing a thermal diffusion at a high temperature of the first dopant.

12. The process according to claim 11 wherein the step of forming the DMOS body regions comprises forming the DMOS body regions aligned with edges of the conductive gate regions, the DMOS body regions being formed by means of a second implantation of a second dopant in a direction orthogonal to the top surface of the integrated circuit, performed with an energy and with a dopant dose such that the respective concentrations of the second dopant have peaks located in the DMOS semiconductor regions at a nonzero distance from the surfaces of the isolated DMOS semiconductor regions.

13. The process according to claim 12 wherein the acute angle has a value of about 30°–45°.

14. The process according to claim 12 wherein said second dopant is implanted in a dose of the order of $10^{13}$ atoms/cm$^2$ and with an energy of about 150–250 keV, and said first dopant is implanted in a dose of the order of $10^{12}$ atoms/cm$^2$ and with an energy of about 150 keV.

15. The process according to claim 12 wherein said isolated DMOS and cell semiconductor regions are isolated from a semiconductor substrate of a first conductivity type by means of respective heavily doped buried regions of a second conductivity type, and isolated from each other by means of vertically extending semiconductor regions of the first conductivity type.

16. The process according to claim 15:
   wherein the step of forming conductive gate regions comprises,
      forming a conductive gate layer over a top surface of the integrated circuit;
      forming a photoresist material layer over the conductive gate layer;
      selectively removing the photoresist material layer and the underlying conductive gate layer to open windows for the second implantation of the second dopant, with the photoresist material layer and the conductive gate layer acting as a mask, to form said DMOS body regions in a self-aligned manner with edges of said windows; and
      removing the photoresist material layer;
   wherein the step of forming the channel regions comprises performing said first implantation of the first dopant through said windows;
   wherein the step of forming the insulative gate regions comprises selectively removing the exposed regions of the insulator layer to form the conductive gate regions for the DMOS devices and for the memory cells, and to open drain windows for the formation of drain regions of the DMOS devices; and
   wherein the process further comprises forming source regions for the DMOS devices inside said channel regions, forming drain regions for the DMOS devices, and forming source and drain regions for the memory cells.

17. The process according to claim 15:
   wherein the steps of forming conductive and insulative gate regions comprises,
      forming a conductive gate layer over the insulator layer;
      forming a first photoresist material layer over the conductive gate layer; and
      selectively removing the first photoresist material layer and the underlying portions of the conductive gate and the insulator layers to define the respective conductive and insulative gate regions for the DMOS devices and for the memory cells, and to open drain windows for the formation of drain regions of the DMOS devices;
   wherein the process further comprises,
      forming a second photoresist material layer over the surface of the integrated circuit; and
      selectively removing the second photoresist material layer from over the insulated semiconductor regions of the DMOS-technology power devices, except from over said drain windows, to open windows for the second implantation of the second dopant, to form said DMOS body regions in a self-aligned manner with edges of the conductive or insulative gate regions;
   wherein the step of forming the channel regions comprises,
      performing said first implantation of the first dopant through said windows in the second photoresist material layer; and wherein the process further comprises,
      removing said second and first photoresist material layers; and
      forming source regions for the DMOS devices inside said channel regions, forming drain regions for the DMOS devices, and forming source and drain regions for the memory cells.

18. The process according to claim 11, further comprising the steps of:
   forming respective laterally displaced isolated bipolar semiconductor regions that are electrically insulated from each other, the DMOS and cell semiconductor regions, and from the common semiconductor substrate; and
   forming bipolar junction transistors inside the respective bipolar semiconductor regions.

19. The process according to claim 11, further comprising the steps of:
   forming respective laterally displaced isolated MOSFET semiconductor regions that are electrically insulated from each other, the DMOS and cell semiconductor regions, and from the common semiconductor substrate; and
   forming N-channel and P-channel MOSFETs inside respective ones of the MOSFET semiconductor regions.

* * * * *